United States Patent [19]

Wu et al.

[11] Patent Number: 5,541,989
[45] Date of Patent: Jul. 30, 1996

[54] METHOD AND APPARATUS FOR DETECTING ADDED KEYBOARD FUNCTIONS

[75] Inventors: Chi-Chang Wu, Hsin-Chu; Dune-Fung Hsiou, Taipei, both of Taiwan

[73] Assignee: United Microelectronics Corp., Hsin-Chu, Taiwan

[21] Appl. No.: 327,767

[22] Filed: Oct. 24, 1994

[51] Int. Cl.$^6$ .................................................. H04M 1/26
[52] U.S. Cl. .......................... 379/368; 379/359; 379/361; 341/26; 341/21
[58] Field of Search .................................. 379/396, 368, 379/359; 341/21, 28, 25, 26

[56] References Cited

U.S. PATENT DOCUMENTS 4,825,464  4/1989  Wen ............................. 379/368
5,101,429  3/1992  Geboers ........................ 379/368
5,117,455  5/1992  Danish ......................... 379/368

Primary Examiner—Jeffery Hofsass
Assistant Examiner—Jacques M. Saint-Surin
Attorney, Agent, or Firm—Barnes, Kisselle, Raisch, Choate, Whittemore, & Hulbert, P.C.

[57] ABSTRACT

A method and apparatus for detecting the added functions of a telephone dialer by adding diodes to the IC circuit and using as part of the input pins such that the need for total number of input pins and thus the manufacturing costs of the IC are reduced. The method is executed by using the available keyboard input/output boards without increasing the need for extra input pins in order to detect whether there is any diode in existence that is connected among the input/output ports.

5 Claims, 5 Drawing Sheets

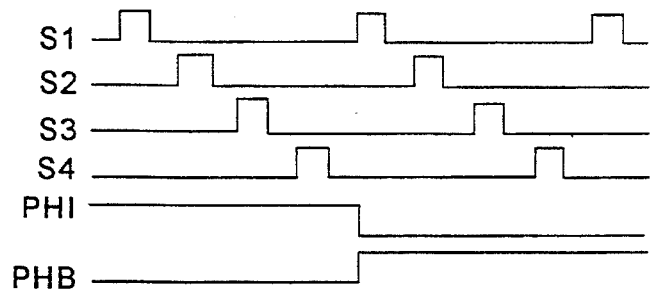
(PRIOR ART)
FIG. 1
(PRIOR ART)
FIG. 2
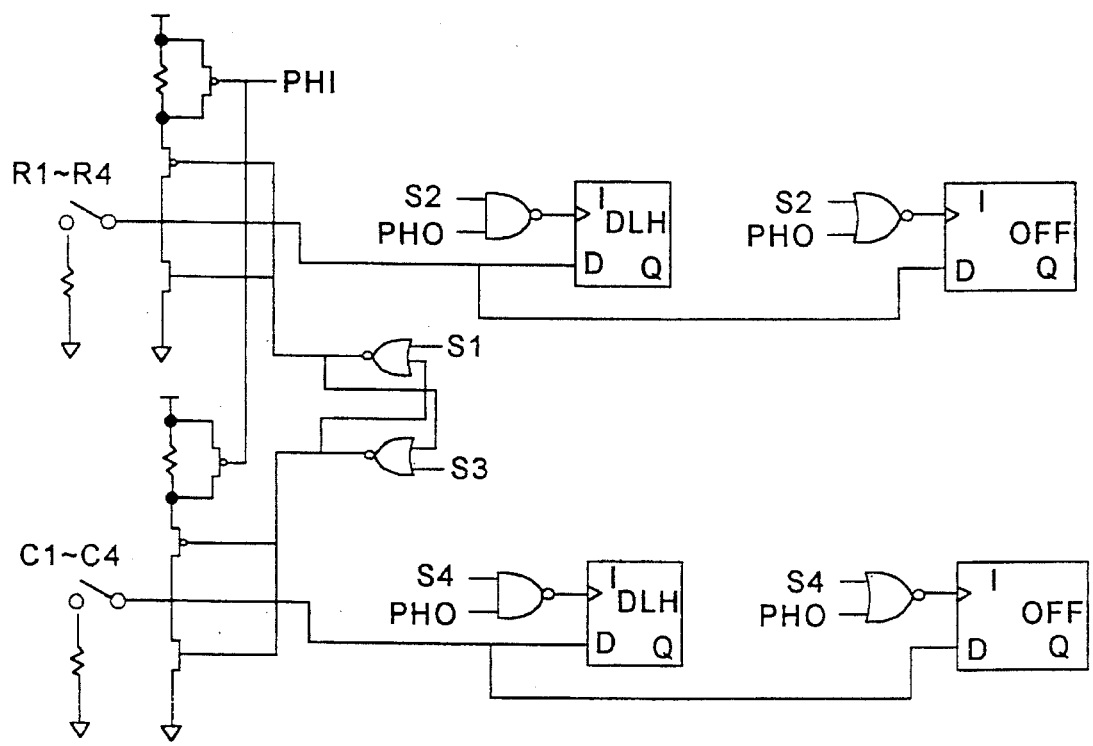
(PRIOR ART)
FIG. 3

METHOD AND APPARATUS FOR DETECTING ADDED KEYBOARD FUNCTIONS

FIELD OF THE INVENTION

The present invention generally relates to a method and apparatus for detecting of keyboard functions and more particularly, relates to a method and apparatus for detecting of keyboard functions by using diodes.

BACKGROUND OF THE INVENTION

An electronic keyboard is extensively used as a user input interface in telephones, computers, and other electronic devices. A circuit coupled to the keyboard detects which key is pressed by a positive-logic scanning and a negative-logic scanning. For instance, as shown in FIG. 1, the keys of a typical keyboard are arranged matrix-like, where R1 to R4 corresponds to row 1 to row 4, and C1 to C4 corresponds to column 1 to column 4. When a key is pressed, its corresponding row line (e.g. R2) and column line (e.g. C3) are to be mutually connected. To attain that, in a negative-logic scanning circuit row lines are firstly set to high voltage level with high impedance, and column lines are set to low voltage level with low impedance. When a row line is connected to a column line, its voltage level drops to the low level. The states of the row lines are stored in a latch circuit. After that, column lines are set to the high voltage level with high impedance, and row lines are set to the low voltage level with low impedance. When the column line is connected to the row line as stated above, its voltage level drops to low level, and the states of the column line are stored in another latch circuit. By reading out the states stored in the latch circuits, the position of the pressed key can be easily determined. The steps described above are typically repeated for several times to confirm that the detected key has been intentionally pressed by user.

The keyboard shown in FIG. 1 is a typical 4×4 matrix keyboard. One of the integrated circuits (ICs) designed for scanning such a keyboard is the UMC91230 chip made by the United Microelectronics Corp. (UMC), which provides eight pins or ports for scanning, R1 to R4 and C1 to C4. Thus, the keyboard can only have 16 input keys. However, more keys are often required in modern applications, and number of pins for the keyboard scanning circuit IC increases as the number of keys which may be scanned increases. Increasing the number of pins raises the cost of manufacture of the IC.

In the detecting of keyboard functions in a telephone dialer, the functions are frequently tested by starting the oscillation of an oscillator after a telephone receiver is taken off-hook and enters into a detection mode. This detects whether there are any resistors grounded outside the keyboard input ports and therefore, determines the added functions of the dialer. The detection method has a drawback in that during the detection of any grounded resistors by the added function selection circuit, a false reading is sometimes obtained after detection caused by a poor cleaning process of the solder points on the circuit board which leads to noise interference during the detection. The process therefore is not effective in detecting the added function selection circuits of a dialer.

In a modern IC chip used in a telephone dialer, it is desirable to use an IC that has the least number of pins such that the package of the IC can be achieved inexpensively.

In the prior art detection method described above, the resistors used in the detection circuit frequently cause false readings due to the high impedance of the resistors used over the keyboard lines for more input function choices.

It is therefore an object of the present invention to provide a detection method for keyboard functions that does not have the drawbacks of the prior art detection method.

It is another object of the present invention to provide a method of detecting keyboard functions by using diodes in the circuit such that the total number of input pin requirement on the IC chip is reduced.

It is yet another object of the present invention to provide a detection method for keyboard functions that produces reliable detect result without false readings.

SUMMARY OF THE INVENTION

The present invention provides a method and apparatus for detecting the added functions of a telephone dialer. Diodes are added to the IC circuit and used as part of the input pins, the need for total number of input pins is thus reduced, and subsequently the manufacturing cost of the IC can be reduced. The method is executed by using the available keyboard input/output ports, without increasing the need for more input pins, in order to detect whether there is any diode in existence that is connected among the input/output ports. The method can be used to detect and select different functions of the keyboard independently without affecting its normal operation. Furthermore, the stability of the system is improved since low resistance diodes are not affected by noise interference.

The detection method comprises the steps of placing a telephone receiver to an off-hook position to start the oscillation of an oscillator, detecting whether the keyboard input/output port is connected to a diode within a preset length of time, latching the condition of whether there is a diode into a latch circuit, ceasing the detection circuit operation after a preset length of time and returning to the normal functions of the circuit.

The present invention is further directed to a detect apparatus which includes a timing generator to produce various control timing signals, a row input/output port for sending the row position of a key on the keyboard to be scanned, a column input/output port for sending the column position of a key on the keyboard to be scanned, a keyboard scanning circuit for detecting the row and column position of a key on the keyboard that is pressed through the row input/output ports and the column input/output ports, a row latch circuit for latching the row position after a key is pressed after a preset time period, a column latch circuit for latching the column position of a key that is pressed after a preset time period, a row detection latch circuit for latching the condition of whether there is a diode within a preset time period and afterward if there is no action in such circuit to maintain the data, and a column detection latch circuit for latching the condition of whether there is a diode in existence within a preset time period and afterward to maintain the data if there is no action in such circuit.

BRIEF DESCRIPTION OF THE DRAWINGS

Other objects, features, and advantages of the present invention will become apparent upon consideration of the specification and the appended drawings in which:

FIG. 1 is a diagram showing a prior art electronic keyboard arrangement.

FIG. 2 is a diagram of timing sequence for the prior art electronic keyboard.

FIG. 3 is a circuit diagram of the prior art electronic keyboard.

DETAILED DESCRIPTION OF THE PREFERRED EMBODIMENT

Figure 4:
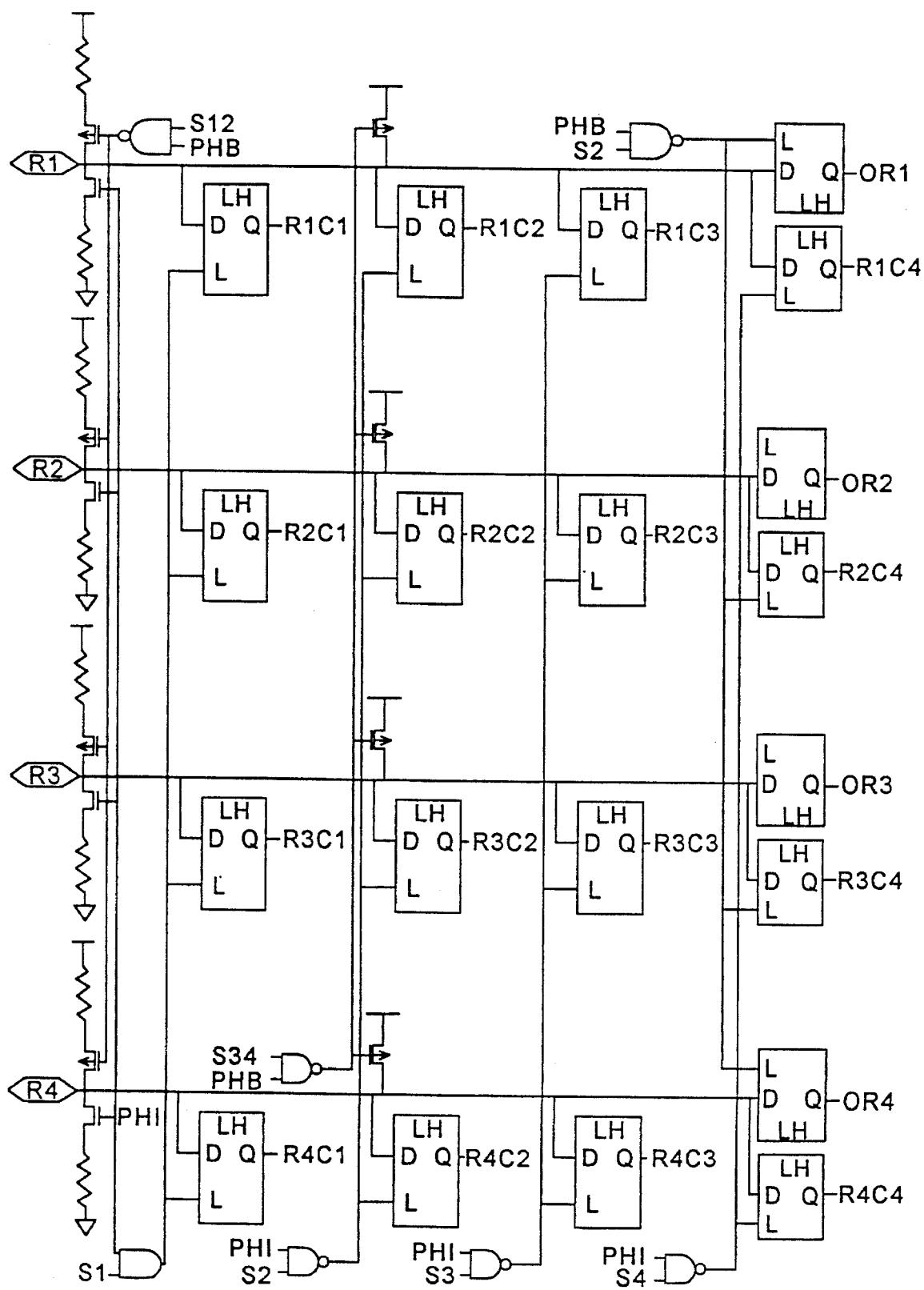
FIG. 4 is a diagram showing a latch circuit for the present invention detection method.

The present invention detection method enables the detection whether there is a diode connected to the keyboard input/output ports after a receiver is taken off-hook and an oscillator started oscillating. After a preset length of time, the condition of the keyboard input/output port detected is latched such that the added functions of the telephone dialer can be detected. The detection method utilizes the forward biased/low resistance characteristics of a diode to detect the added functions of the keyboard. In the meantime, the reverse biased/high resistance characteristics of a diode is used during the scanning such that the normal operation of the circuit is not affected. Moreover, more input functions can be implemented without the need to increase the pin count of the IC. The present invention detection method therefore overcomes the drawbacks of the prior art method and improves its applicability.

Referring initially to FIGS. 1, 2 and 3 and assuming that in circuit 20 a timing pulse sequence of S1~S4, PHI and PHB of an oscillator (not shown) is utilized, when a telephone receiver is first picked up (or placed in an off-hook position) and before a preset time is reached, PHI is at a high level, S1 is at a high level, row signals R1~R4 are at high levels and high impedance, while the column signals C1~C4 are at low level and low impedance. When any of the row ports is connected to a ground resistor, the corresponding row signal is reduced to a low level. At the end of the S2 high pulse, the level of the row signal will be recorded by the data flip-flop (DFF) 22. Immediately thereafter, following the S3 high pulse, the row signals R1~R4 are at low level and low impedance. The column signals C1~C4 change to high level and high impedance. If any of the ports is connected to a ground resistor, its corresponding column signal is reduced to a low level. Similarly, at the end of the S4 high pulse, the level of the column signal will be recorded by the data flip-flop 24.

After a preset time is reached, PHI changes into low level while the data flip-flop 22 and 24 are closed and the added input functions are recorded within them. The voltage positions of the scanning row signals R1~R4 and column signal C1~C4 are then repeated by following the timing pulse sequence S1~S4. The signals of keyboard ports can be latched in data latch 26 and 28 such that the normal scanning functions of the keyboard can be executed.

Each time when a telephone receiver is picked up, the detection sequence described above is repeated. When a grounded resistor is connected to the row ports/column ports, the added functions of the telephone dialer can be tested. An inherent problem in this circuit is that during the manufacturing process of the board, if it is not cleaned adequately after soldering, a low value resistance exists between the row ports/column ports and other connection points. In order not to affect the normal functions of the circuit, the ground resistor must be of high resistance. Therefore, when row signals R1~R4 during timing sequence S1 and column signals C1~C4 during timing sequence S3 both have high levels and high impedance, it is not possible to reduce them to low levels by a ground resistor. This frequently leads to a false reading.

Figure 5:
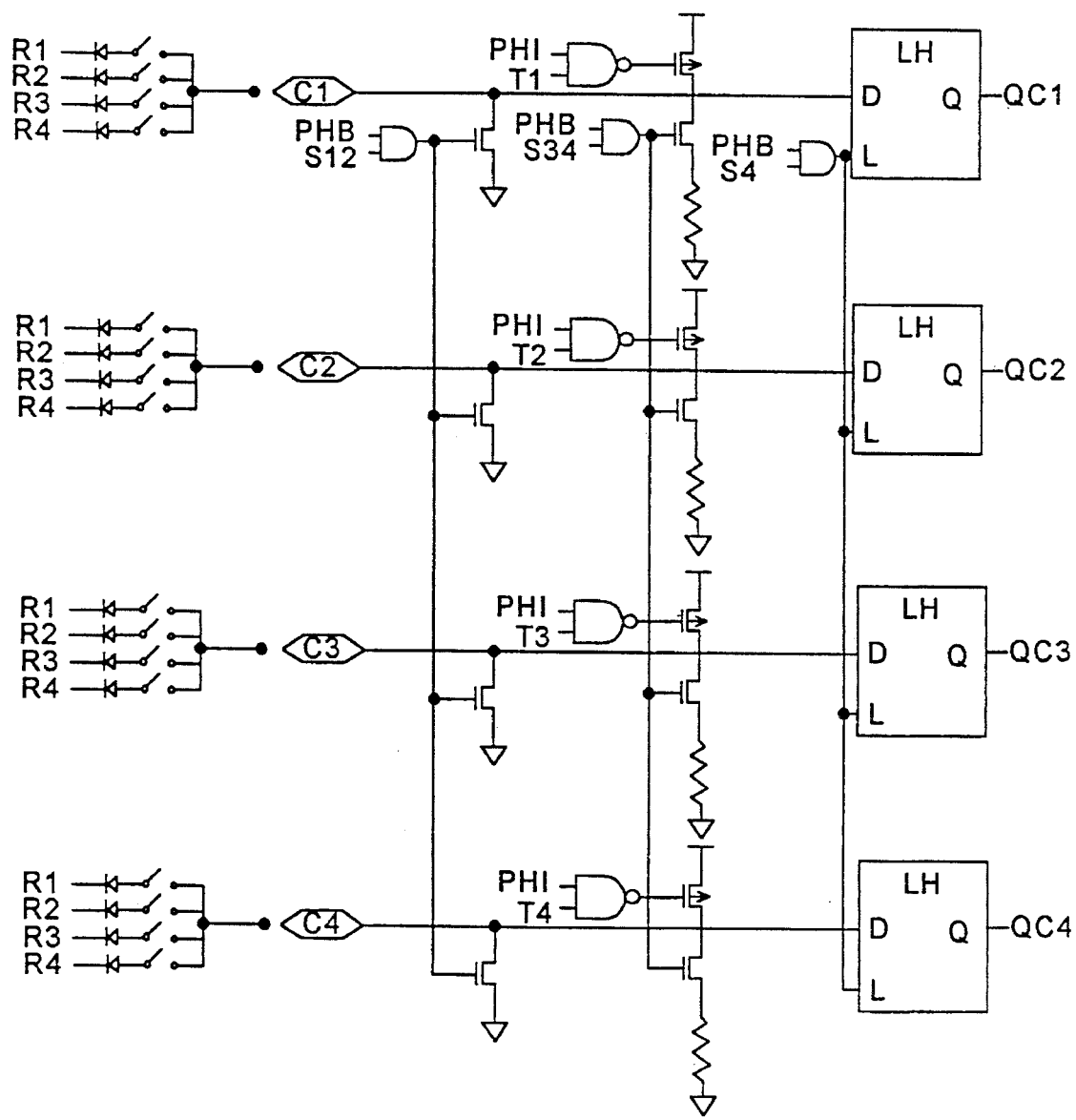
FIG. 5 is a diagram showing the latch circuit for the present invention detection apparatus.
Figure 6:
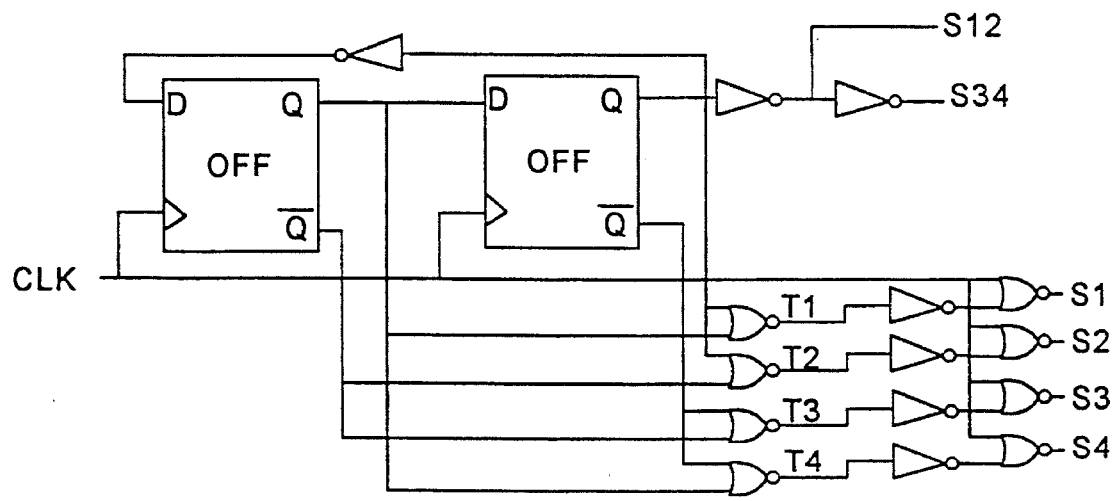
FIG. 6 is a logic diagram for the present invention detection apparatus.
Figure 7:
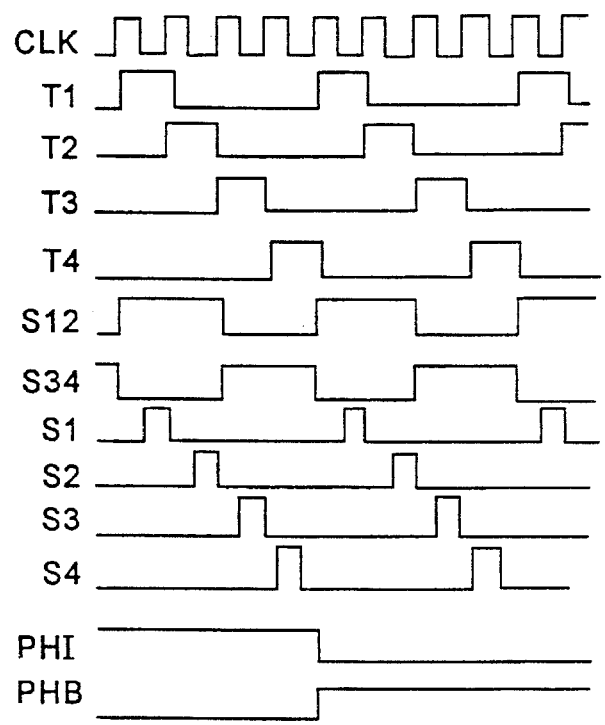
FIG. 7 is a diagram showing the timing sequence for the present invention detection method.

FIG. 4 and FIG. 5 show circuit diagrams of the present invention. The system timing starts from FIG. 6 while its corresponding timing waveform is shown in FIG. 7. When a telephone receiver is first picked up, PHI is at a high level, T1 is at a high level, row signals R1~R4 are at low level and high impedance, and column signal C1 is at a high level and a low impedance. If column port C1 is connected with a forward biased diode, its corresponding row signal is raised to a high level. Otherwise, it stays at the low level. At the end of the timing sequence S1, the levels of row signals will be latched by the four latching components 30, 32, 34, 36. The outputs are R1 C1, R2 C1, R3 C1, and R4 C1, respectively. If the output is a logic "1," it indicates that the corresponding column/row is connected to a forward biased diode.

Immediately following the timing sequence T2, the column signal C2 is at a high voltage and low resistance. At the end of the timing sequence S2, the voltages of the row signals will be latched by the four latching components 38, 40, 42, 44. Thereafter, the timing sequence T3, S3, T4, and S4 are similarly completed and the row signals are similarly latched by the other eight latching components. After the preset time is reached, PHI converts to a low level which indicates the end of the detection sequence.

The preset time can be one testing cycle (S1~S4) or several. For there may exist some electrical charges over the keyboard ports, more testing cycles of the preset time can provide better detection.

From the output R1 C1, R2 C2 . . . of the sixteen latching components, it is possible to determine whether there is any diode connected to the row/column ports. A normal scanning can then be started with S12 at high level, S34 at low level, row signals R1~R4 at high level and low impedance, and column signals C1~C4 at low level and high impedance. When any of the keys is pressed, a row signal will be reduced to a low level. At the end of the timing sequence S2, the levels of the row signals will be latched to QR1~QR4. S12 is then changed to a low level, S34 to a high level, row signals R1~R4 at high level and low impedance, and the column signals C1~C4 at low level and high impedance. When any of the keys is pressed, then one of the column signals will be raised to a high level. At the end of timing sequence S4, the level of the column signal will be latched to QC1~QC4. It should be noted that when any of the row Rn is pressed, the corresponding scanning output signal QRn will be at a low level, it will otherwise be at a high level. Similarly, when any of the column Cm is pressed, the scanning output QCm will be at a high level, it will otherwise be at a low level. The positions of the input keys can then be determined by QR1~QR4 and QC1~QC4.

Figure 8:
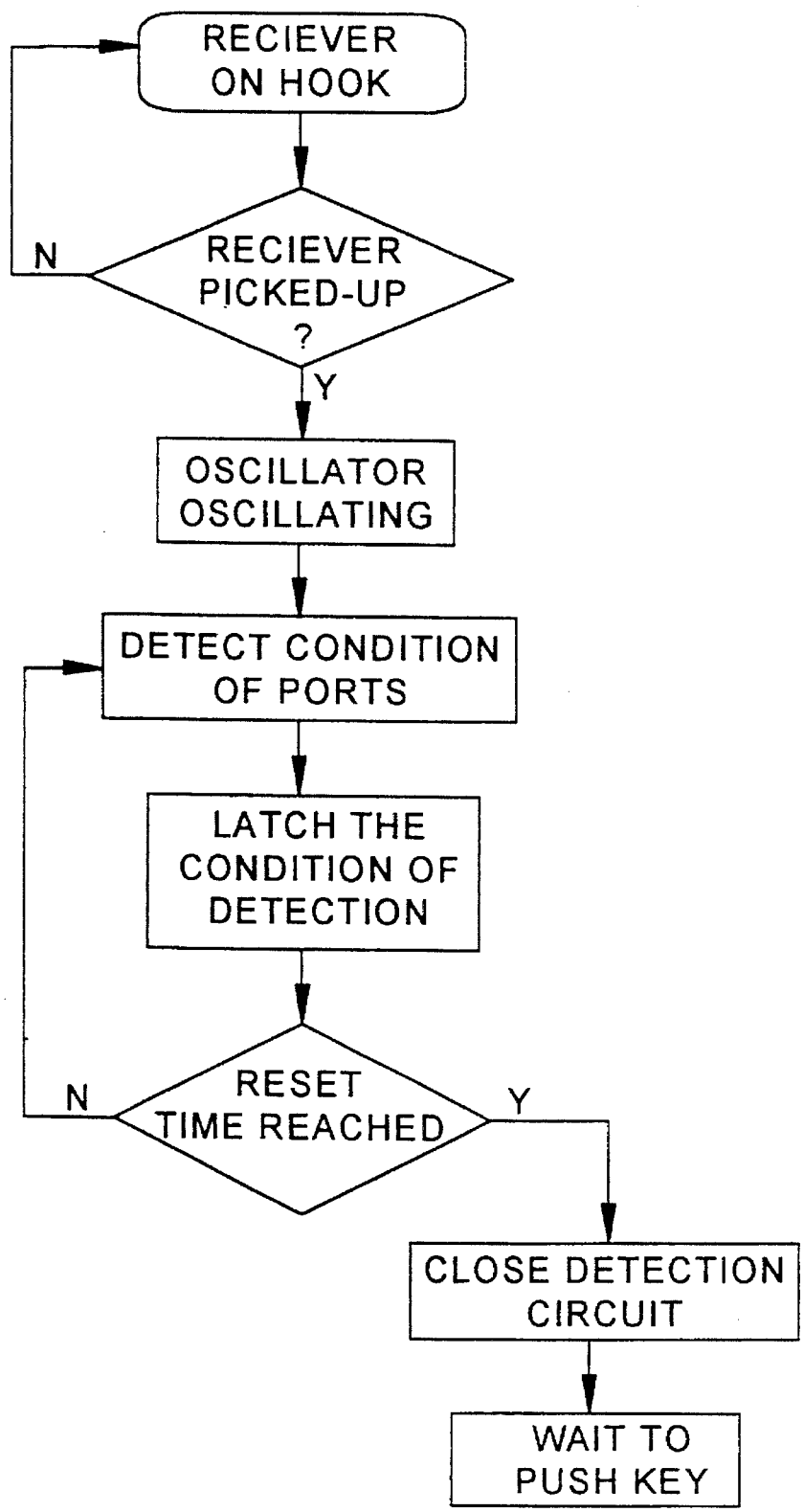
FIG. 8 is a flow-chart showing the present invention detection method.

FIG. 8 shows the flow chart of the above-described consequence. The initial state corresponds to the receiver being on-hook. Then it is picked up (and can be replaced again as it is shown by the diamond alternative). After the receiver has been picked up, the oscillator starts operating. Within the preset time a port condition detection occurs, with the results of the detection latched. As soon as the preset time has elapsed, the detection circuit ceases the operation, and keys of the keyboard are ready to be depressed.

While the present invention has been described in an illustrative manner, it should be understood that the terminology used is intended to be in nature of words of description rather than limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A method for detecting functions of a telephone set keyboard having row and column circuits and equipped with diodes for performing added functions, said method comprising steps of:

placing a telephone receiver of said telephone set to an on-hook position;

generating timing sequences for controlling opening and closing corresponding row/column circuits;

detecting within a preset length of time whether an input/output port is connected to a diode;

latching a result of said detecting into a latch circuit;

ceasing said detecting after elapsing said preset length of time;

whereby keys of said keyboard are ready to be depressed.

2. The method according to claim 1, wherein said detecting is performed successively for all rows and columns of said telephone set keyboard.

3. An apparatus for detecting functions of a telephone set keyboard with row and column circuits and with diodes for performing added functions, said apparatus comprising;

a timing generator to produce timing pulse sequences of detecting signals, a row input/output port for sending a row position of a key on the telephone set keyboard to be scanned, a column input/output port for sending a column position of a key on the telephone set keyboard to be scanned, a diode connected between said row input/output port and said column input/output port of said telephone set keyboard, a keyboard scanning circuit for detecting a row and column position of a key on the telephone set keyboard that is pressed through the row input/output ports and the column input/output ports, a row latch circuit for latching a row position after a key is pressed after a preset time period, a column latch circuit for latching a column position after a key is pressed after a preset time period, a row detection latch circuit for latching a condition of whether there is a diode within a preset time period, and a column detection latch circuit for latching a condition of whether there is a diode in existence within a preset time period.

4. The apparatus for detecting functions of a telephone set keyboard according to claim 3, wherein said row latch circuit is provided for all rows of said telephone set keyboard.

5. The apparatus for detecting functions of a telephone set keyboard according to claim 3, wherein said column latch circuit is provided for all columns of said telephone set keyboard.

* * * * *